(12) United States Patent
Schmidt et al.

(10) Patent No.: US 7,554,465 B2
(45) Date of Patent: Jun. 30, 2009

(54) SAMPLING RATE CONVERSION SYSTEM

(75) Inventors: Gerhard Uwe Schmidt, Ulm (DE);
Mohamed Krini, Ulm (DE); Martin Rößler, Ulm (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 11/855,575

(22) Filed: Sep. 14, 2007

(65) Prior Publication Data
US 2008/0151984 A1 Jun. 26, 2008

Related U.S. Application Data

(63) Continuation of application No. 11/657,408, filed on Jan. 24, 2007, now abandoned.

(30) Foreign Application Priority Data

Jan. 24, 2006 (EP) .................................. 06001452

(51) Int. Cl.
*H03M 7/40* (2006.01)
(52) U.S. Cl. ....................... 341/61; 708/290; 708/313

(58) Field of Classification Search ............... 341/61; 708/290, 313
See application file for complete search history.

(56) References Cited

U.S. PATENT DOCUMENTS

| 6,427,157 | B1 * | 7/2002 | Webb | .................. 708/313 |
| 6,711,214 | B1 | 3/2004 | Hershberger | |
| 7,129,861 | B2 * | 10/2006 | Avantaggiati | ............. 341/61 |

FOREIGN PATENT DOCUMENTS

| EP | 0 977 360 A2 | 2/2000 |
| EP | 1 569 335 A1 | 8/2005 |

\* cited by examiner

*Primary Examiner*—Khai M Nguyen
(74) *Attorney, Agent, or Firm*—Brinks Hofer Gilson & Lione

(57) ABSTRACT

A sampling rate conversion system reduces the signal processing burdens carried by cellular phones, headsets, and other electronic devices. Because the system consumes fewer resources to convert between signal sampling rates, the system may significantly reduce processing time and resource requirements in the device. As a result, the device may instead devote resources to performing other useful tasks, such as interacting with the user through a graphical user interface and performing selected processing tasks.

20 Claims, 7 Drawing Sheets

SAMPLING RATE CONVERSION SYSTEM

PRIORITY CLAIM

This application is a continuation of U.S. patent application Ser. No. 11/657,408, filed Jan. 24, 2007, which claims the benefit of priority from European Patent Application No. 06001452.9, filed Jan. 24, 2006, both of which are incorporated by reference herein.

BACKGROUND OF THE INVENTION

1. Technical Field

This disclosure relates to signal processing, and in particular, to sampling rates of signals.

2. Related Art

Electronic devices that communicate with one another process signals at different sampling rates. To use a signal, a device may need to convert a signal having one sampling rate into a signal having a different sampling rate. For instance, a Bluetooth headset for a cellular phone may up-sample the signal obtained from the cellular phone before the headset further processes the signal. In the context of telephony, signals are often band limited to between less than 300 Hz to 3.4 kHz, thereby severely limiting speech quality. Accordingly, pre-processing functions, such as increasing the sampling rate using interpolation, may be performed prior to an analysis done on the band limited signal in order to generate an extended bandwidth signal that supports enhanced speech quality.

Sampling rate conversion techniques, specifically up-sampling techniques, may use interpolation, such as Lagrange interpolation and cubic splines polynomial fitting. Other systems may convert between sampling rates by highly oversampling a signal and choosing the closest artificially generated time sample. In these systems, the higher the over-sampling rate, the lower the corresponding error is, Some systems may use a quasi-continuous interpolation of individual samples x(n) of a continuous absolutely integrable signal x(t), employing the sinc function, to generate a signal value at the desired sampling time $T_a$, as follows:

$$x(T_a) = \sum_{n=-\infty}^{\infty} x(n) h_s(T_a - nT_{in}),$$

with $$h_s(t) = \text{sinc}(f_{in}t) := \frac{\sin(\pi f_{in}t)}{\pi f_{in}t},$$

with $T_{in}$ denoting the input sampling period, and $f_{in}$ denoting the input sampling rate.

These systems and methods may require a large amount of resources. Some systems may need a long computing time to perform calculations. Other systems may require a large amount of memory to store sample information. Thus, sampling rate conversion remains a significant problem in modem signal processing systems and in modem devices that often have severely limited processing capability, memory resources, and power reserves.

Therefore, a need exists for an improved sampling rate conversion system.

SUMMARY

A sampling rate conversion system decreases signal processing burden on cellular phones, headsets, and other electronic devices. Such devices may have limited processing, memory, and power resources. The conversion system in the device may consume significantly less computing time and memory resources to convert between sampling rates. Relieved of some of the signal processing burden, the device may instead execute other useful tasks and operations.

The sampling rate conversion system converts an input signal sampling rate to a different output signal sampling rate. The system may produce the output signal sampling rate by processing the input signal using up-sampling, filtering, time-delaying, weighting, and adding logic. The system may down-sample an intermediate signal to produce an output signal. The filtering may use a finite impulse response filter and convolution. A controller may choose appropriate weight factors and down-sample factors in order to create a correspondence between sampling instants of the input signal and sampling instants of the output signal at a chosen output signal sampling rate. The system may also convert time-dependent sampling rates of the output and/or input signals by using buffers.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A sampling rate conversion system adapts the sampling rate of an input signal into a different sampling rate for an output signal. The input signal may be a digital signal sampled from an analog signal at an input signal sampling rate. The system may generate an output signal from the input signal using logic that implements up-sampling, filtering, time-delaying, weighting, adding, and other operations. The system may also filter the signal during processing using a low-pass filter that may be a finite impulse response filter. The system may also down-sample an intermediate signal (such as the signal obtained by the adder) to produce the output signal. The system may generate time-dependent sampling rates for the output signal and/or the input signal by using buffers or other logic. The sampling rate conversion system may use a relatively small amount of computing resources and memory, thereby freeing the device that processes the signal to devote more resources to other useful operations, such as interacting with a user through a graphical user interface, executing user commands, and other operations.

Figure 1:
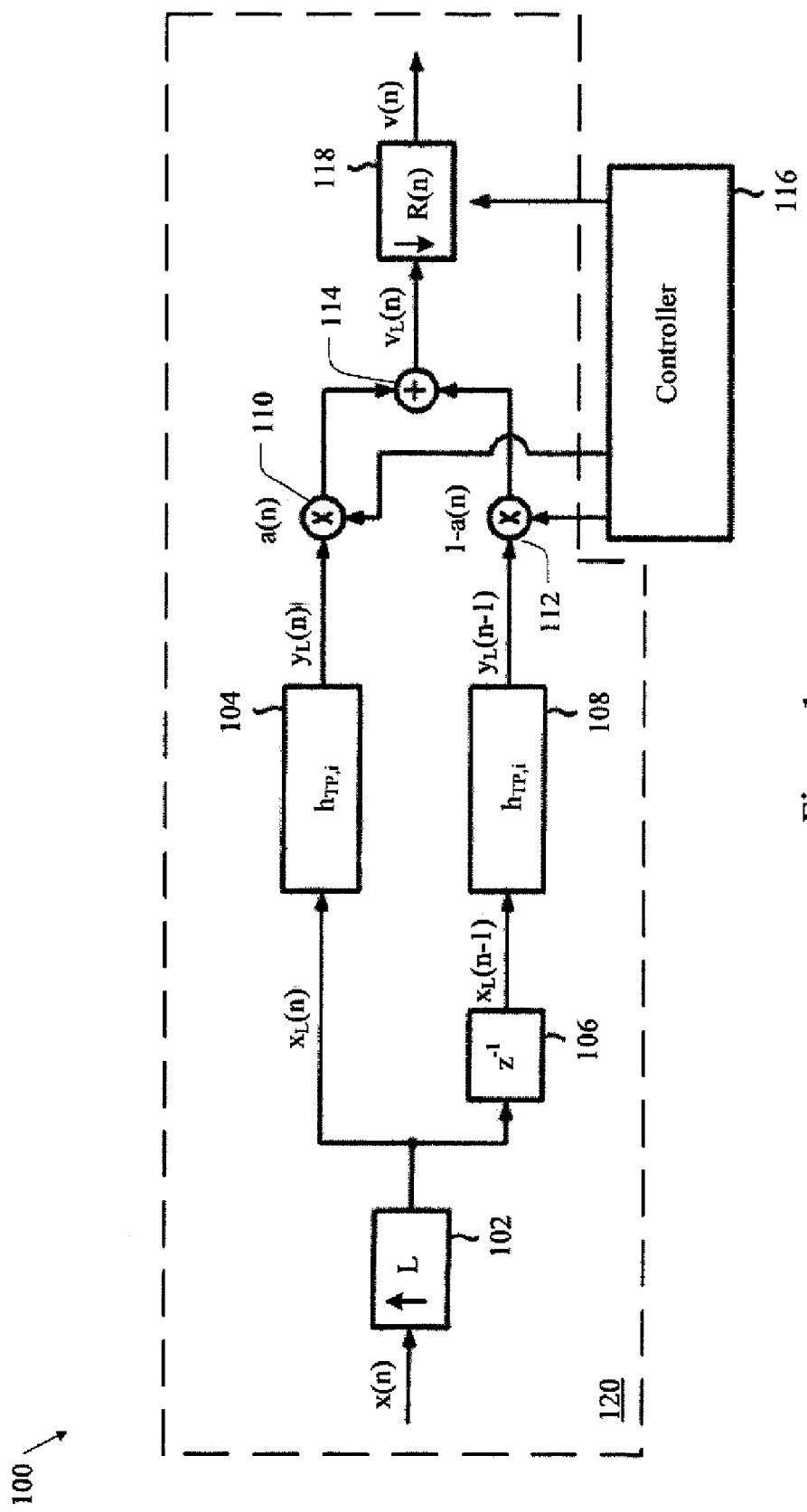
FIG. 1 is a block diagram of a system that converts between sampling rates.

FIG. 1 is a block diagram of a system 100 that converts an input signal sampling rate to an output signal sampling rate. FIG. 1 shows a sampling rate conversion to obtain an output signal v(n), where n denotes a discrete time index, having an output signal sampling rate $f_{out}$. The system obtains $f_{out}$ from an input signal x(n) having an input signal sampling rate $f_{in}$. The system 100 includes a controller 116 and a sampling rate conversion logic 120. The sampling rate conversion logic 120 includes an up-sampler 102, first convolution logic 104, a time delay element 106, second convolution logic 108, multipliers 110 and 112, an adder 114, and a down-sampler 118.

The up-sampler 102 may up-sample the input signal x(n) to a sampling rate $f_{up} > f_{in}$ by a factor of L, where L is an integer, e.g., $f_{up} = L \cdot f_{in}$. The up-sampler 102 may generate an up-sampled signal $x_L(n)$ by inserting L−1 nulls between the samples of the original signal, e.g., $x_L(n) = x(n/L)$, if mod (n, L)=0, and $x_L(n)=0$, otherwise. The system 100 may employ other up-sampling techniques, however. The up-sampler 102 may be coupled to the first convolution logic 104 and the time delay element 106.

The first convolution logic 104 may convolve the up-sampled signal $x_L(n)$ with an impulse response of a low-pass filter with coefficients $h_{TP,i}$ to generate a filtered non-delayed up-sampled signal $y_L(n)$:

$$y_L(n) = \sum_{i=-\infty}^{\infty} x_L(n-i) h_{TP,i}.$$

Because $x_L(n)$ is generated by inserting L−1 nulls in the up-sampler 102, the filtered non-delayed up-sampled signal $y_L(n)$ is given by:

$$y_L(n) = \sum_{k=0}^{\lceil \frac{N}{L} \rceil} x_L(n - kL - \mathrm{mod}(n, L)) h_{TP, kL + \mathrm{mod}(n,L)}.$$

The system 100 may use $X_L(n)$ only for non-vanishing values. As a result, the filtered non-delayed up-sampled signal $y_L(n)$ may be expressed as:

$$y_L(n) = \sum_{k=0}^{\lceil \frac{N}{L} \rceil} x(\lfloor n/L \rfloor - k) h_{TP, kL + \mathrm{mod}(n,L)},$$

where N denotes the number of filter coefficients of the low-pass filter and the symbols ⌈ ⌉ and ⌊ ⌋ denote rounding to the closest larger or smaller integer, respectively.

The time delay element 106 may delay the up-sampled signal $x_L(n)$ by one sampling instant to generate a time-delayed signal $x_L(n-1)$. The time delay element 106 may be coupled to the second convolution logic 108. The second convolution logic 108 may convolve the time-delayed up-sampled signal $x_L(n-1)$ with an impulse response of a low-pass filter with coefficients $h_{TP,i}$ delayed by one sampling instant to generate a filtered delayed up-sampled signal $y_L(n-1)$. To prevent aliasing, a finite impulse response (FIR) filter may be used for the low-pass filter in the first convolution logic 104 and the second convolution logic 108.

The output of the first convolution logic 104 and the output of the second convolution logic 108 may be coupled to the multipliers 110 and 112, respectively. The multipliers 110 and 112 may multiply the filtered up-sampled signals $y_L(n)$ and $y_L(n-1)$ by weight factors, such as a(n) and 1−a(n). The multiplier 110 and 112 may be coupled to the adder 114, which may add the weighted signals to generate an output signal $v_L(n)$.

The controller 116 may be coupled to the multipliers 110 and 112 and the down-sampler 118. The controller 116 may provide time-dependent weight factors, such as a(n) and 1−a(n) or about 1−a(n) to the multipliers 110 and 112. The output signal $v_L(n)$ has an output signal sampling rate different than the input signal sampling rate of the input signal x(n). The output signal $v_L(n)$ is given by the weighted sum of $y_L(n)$ and $y_L(n-1)$:

$$v_L(n) = a(n) y_L(n) + (1 - a(n)) y_L(n-1).$$

The weighting and convolution logic may implement:

$$v_L(n) = x^T(n) h_{TP}(n)$$

where the superscript T indicates the transposition operation, the signal vector is:

$$x(n) = \begin{bmatrix} x(\lfloor n/L \rfloor) \\ x(\lfloor n/L \rfloor - 1) \\ \ldots \\ x(\lfloor n/L \rfloor - \lceil N/L \rceil) \end{bmatrix}$$

and the time-dependent filter vector of the low-pass filter is:

$$h_{TP}(n) = a(n) \begin{bmatrix} h_{TP, \mathrm{mod}(n,L)} \\ h_{TP, L + \mathrm{mod}(n,L)} \\ \ldots \\ h_{TP, L\lceil N/L \rceil + \mathrm{mod}(n,L)} \end{bmatrix} + (1 - a(n)) \begin{bmatrix} h_{TP, \mathrm{mod}(n,L) - 1} \\ h_{TP, L + \mathrm{mod}(n,L) - 1} \\ \ldots \\ h_{TP, L\lceil N/L \rceil + \mathrm{mod}(n,L) - 1} \end{bmatrix}.$$

The controller 116 may choose a(n) to approximately calculate the signal value for any selected sampling instant, e.g., the selected discrete time point at which an individual sample of a signal is taken.

The sampling rate $f_{up}$ of the output signal $v_L(n)$ may be higher than the output sampling rate $f_{out}$ that v(n) exhibits. Thus, $v_L(n)$ is optionally down-sampled in the down-sampler 118. The controller 116 may select the down-sampling factor R(n) for the down-sampler 118. The controller 116 may select the value of a(n) and the down-sampling factor R(n) such that each sampling instant of the original signal corresponds to a sampling instant in the output signal. In other words, no samples of the input signal are lost. The controller 116 may choose the parameters as follows:

$$R(n) = \left\lfloor n\frac{f_{in}}{f_{out}}L \right\rfloor - \sum_{m=0}^{n-1} R(m) + \left\lceil n\frac{f_{in}}{f_{out}}L \right\rceil \delta_K(n)$$

and $$a(n) = 1 - \left(\left\lfloor n\frac{f_{in}}{f_{out}}L \right\rfloor - n\frac{f_{in}}{f_{out}}L + f_0 \delta_K(n)\right)$$

where $\delta^K$ is the Kronecker-Delta function, L is the factor by which the input signal sampling rate $f_{in}$ of the input signal is up-sampled to the output signal sampling rate $f_{out}$ of the output signal, and $f_0$ may be expressed as:

$$f_0 = \left(\left\lfloor \frac{f_{in}}{f_{out}}L \right\rfloor - \frac{f_{in}}{f_{out}}L\right).$$

Thus, the output signal v(n) with a resultant output signal sampling rate higher than the input signal sampling rate of the input signal x(n) but lower than the output signal sampling rate of $v_L(n)$ may be obtained as $$v(n) = \left(1 - \left\lfloor n\frac{f_{in}}{f_{out}}L \right\rfloor + n\frac{f_{in}}{f_{out}}L - f_0\delta_K(n)\right) y_L \sum_{m=0}^{n} R(m) +$$

-continued $$\left(\left\lfloor n\frac{f_{in}}{f_{out}}L \right\rfloor - n\frac{f_{in}}{f_{out}}L + f_0\delta_K(n)\right) y_L \left(\sum_{m=0}^{n} R(m) - 1\right).$$

Figure 2:
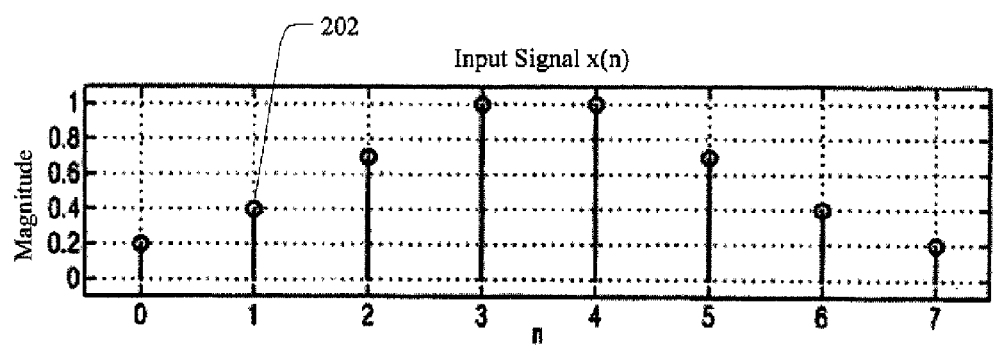
FIG. 2 is a diagram of a discrete signal.
Figure 3:
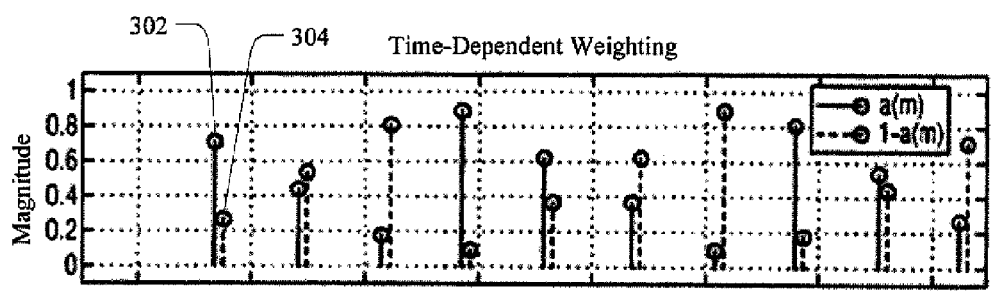
FIG. 3 is a diagram of a time-dependent weighting of a signal.
Figure 4:
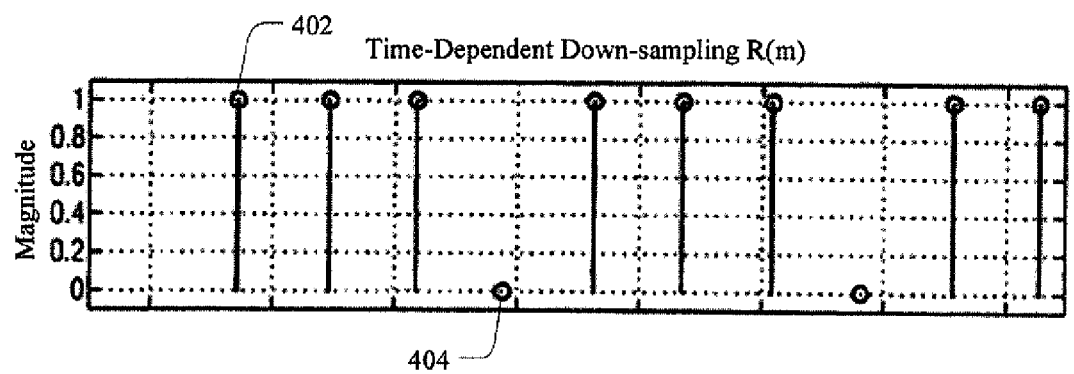
FIG. 4 is a diagram of a time-dependent down-sampling of a signal.
Figure 5:
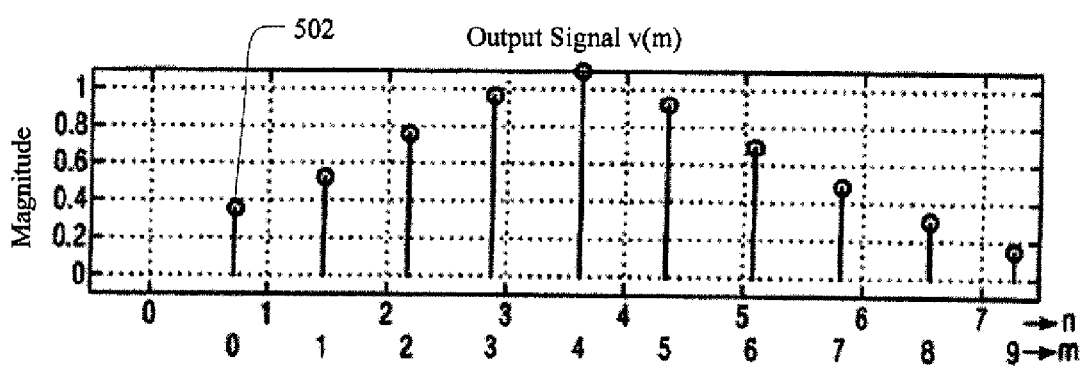
FIG. 5 is a diagram of a second discrete signal.

FIGS. 2 through 5 show signals at various points in the sampling rate conversion system 100 as the system 100 converts the input signal sampling rate of the original input signal x(n) to an output signal sampling rate for the output signal v(m) shown in FIG. 5. FIG. 2 is a discrete input signal x(n) with an exemplary sampling rate of 8 kHz or about 8 kHz. In FIG. 2, eight sampling points (n=0 to n=7) are shown for the input signal x(n), such as the input signal sampling point 202. FIG. 3 is a time-dependent weighting of the input signal x(n) with weight factors a(m) and 1−a(m). FIG. 3 shows a weighted input signal sample 302, weighted by a(m), and a weighted input signal sample 304, weighted by 1−a(m).

FIG. 4 is a time-dependent down-sampling of the weighted signal samples. In FIG. 4, the down-sampling factor is R(m). For example, the down-sampling factor 402 causes the system 100 to retain the weighted signal sample, while the down-sampling factor 404 causes the system 100 to effectively eliminate a weighted signal sample.

FIG. 5 is a discrete output signal v(m) with an exemplary sampling rate of 11.025 kHz or about 11.025 kHz. FIG. 5 shows ten sampling points (m=0 to m=9), such as the output signal sampling point 502, for the output signal v(m). FIG. 5 shows the output signal sampling points that correspond to the eight sampling points of the input signal x(n). In the example given by FIGS. 2 through 5, the up-sampling factor L is set to 1 or about 1.

Figure 6:
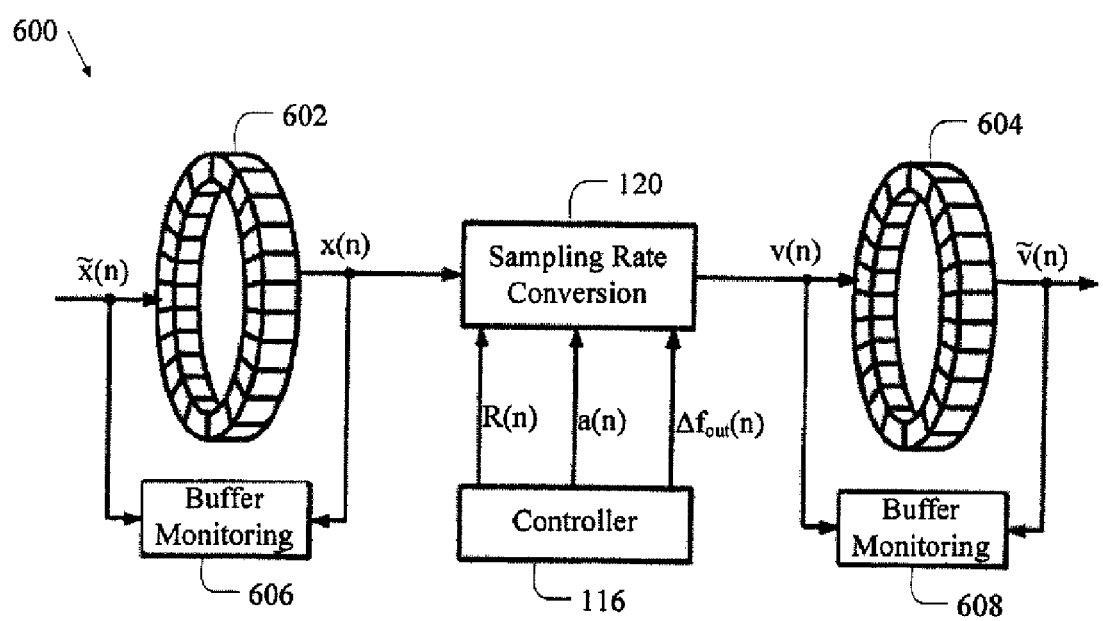
FIG. 6 is a block diagram of a system that converts a sampling rate to a time-dependent output sampling rate.

FIG. 6 is a block diagram of a system 600 that produces a time dependent output signal sampling rate. FIG. 6 shows a sampling rate conversion system 600 that includes ring buffers 602 and 604, buffer monitoring logic 606 and 608, sampling rate conversion logic 120, and a controller 116. In FIG. 6, the input signal x̃(n) and the output signal v(n) of the sampling rate conversion logic 120 are buffered in ring buffers 602 and 604, respectively. Alternatively, only one of the input signal and the output signal may be buffered in a ring buffer.

The system 600 monitors the write/read pointers associated with the buffer monitoring logic 606 and 608. The system 600 may thereby determine when either of the buffers 606 and 608 are empty or have overflowed. The system 600 may correct the output signal sampling rate to avoid an empty or overflow state of one of the buffers and to improve processing of the input signal. The output signal sampling rate $f_{out}$ may be expressed as the sum of a constant term $\bar{f}_{out}$ and a time-dependent correction term $\Delta f_{out}(n)$: $f_{out} = \bar{f}_{out} + \Delta f_{out}(n)$ where $$\Delta f_{out}(n) = \begin{cases} \min\{\Delta f_{out}(n-1) + \Delta, \Delta f_{out,max}\}, & \text{if the } \textit{remaining buffer capacity of the second buffer} \\ & \text{is below a first predetermined capacity } \textit{hreshold} \\ \max\{\Delta f_{out}(n-1) - \Delta, \Delta f_{out,min}\}, & \text{if the } \textit{remaining buffer capacity of the second} \text{ buffer} \\ & \text{is } \textit{above a second predetermined} \text{ capacity } \textit{hreshold} \\ \Delta f_{out}(n-1), & \text{else} \end{cases}$$

and $\Delta$ represents the maximum change of the sampling rate from one sampling instant to the subsequent sampling instant. The maximum change parameter $\Delta$ may be in the range of about $10^{-7}$ Hz to about 0.01 Hz. The system 600 may employ other values, however.

The system 600 may perform the processing noted above in reference to FIG. 1 using the time-dependent output signal sampling rate including the correction term $\Delta f_{out}(n)$. The system 600 thereby obtains the output signal characterized by the selected time-dependent output signal sampling rate. The output signal v(n) of the sampling rate conversion logic 120 may be expressed as:

$$v(n) = \left(1 - \left\lfloor \sum_{i=0}^{n} \frac{f_{in}}{f_{out}(i)}L \right\rfloor + \sum_{i=0}^{n} \frac{f_{in}}{f_{out}(i)}L - f_0\delta_K(n)\right) y_L \left(\sum_{m=0}^{n} R(m)\right) +$$

$$\left(\left\lfloor \sum_{i=0}^{n} \frac{f_{in}}{f_{out}(i)}L \right\rfloor - \sum_{i=0}^{n} \frac{f_{in}}{f_{out}(i)}L + f_0\delta_K(n)\right) y_L \left(\sum_{m=0}^{n} R(m) - 1\right)$$

with the down-sampling factor:

$$R(n) = \left[\sum_{i=0}^{n} \frac{f_{in}}{f_{out}(i)} L\right] - \sum_{m=0}^{n-1} R(m) + \left[\frac{f_{in}}{f_{out}} L\right] \delta_K(n).$$

Similarly, signal processing may be performed for a time-dependent input sampling rate where the input signal x(n) is sampled from a continuous analog signal at temporally varying rates.

Figure 7:
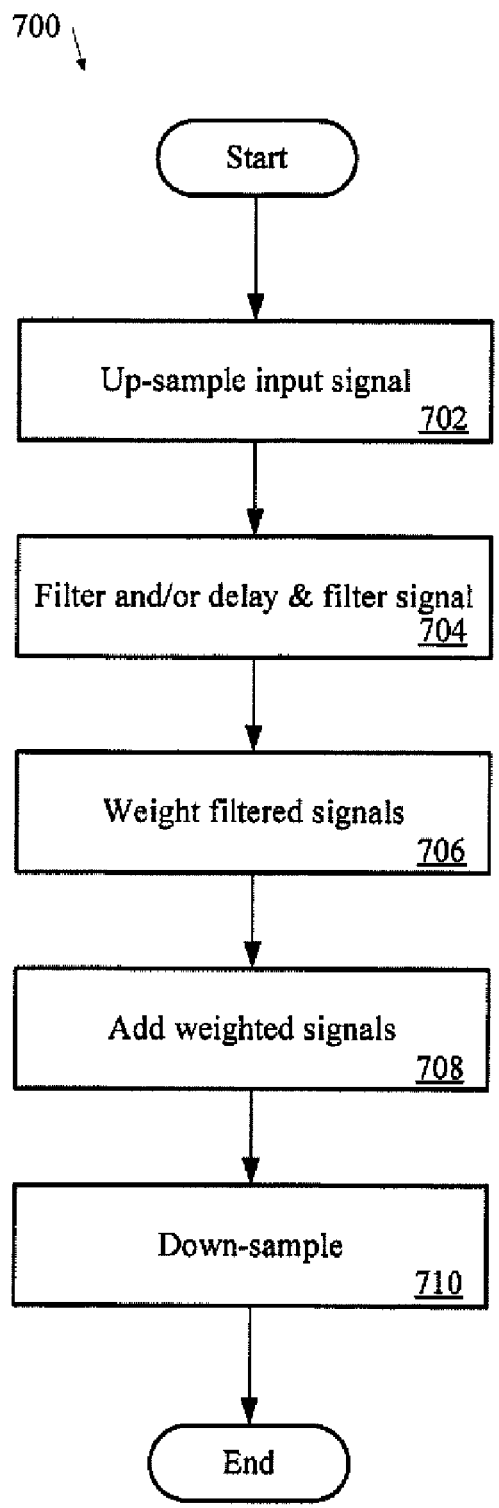
FIG. 7 shows acts that the system may take to convert between sampling rates.

FIG. 7 shows the acts 700 that the system 100 may take to convert an input signal sampling rate to an output signal sampling rate. The system 100 up-samples, by a factor of L, a discrete input signal (Act 702). The system 100 may also filter the up-sampled signal and/or delay and filter the up-sampled signal (Act 704). To that end, the system 100 may convolve the up-sampled signal with an impulse response of a low-pass filter.

The system may also weight the filtered signals by selected weight factors (Act 706). The system 100 may add the weighted signals to generate a discrete output signal (e.g., an intermediate output signal $v_L(n)$) with a different output signal sampling rate than the input signal sampling rate present in the input signal (Act 708). In addition, the system 100 may also down-sample the intermediate output signal to produce a resultant discrete output signal (e.g., v(n)) with a resultant signal sampling rate different from either the input signal sampling rate of the input signal (Act 710) and the output signal sampling rate.

Figure 8:
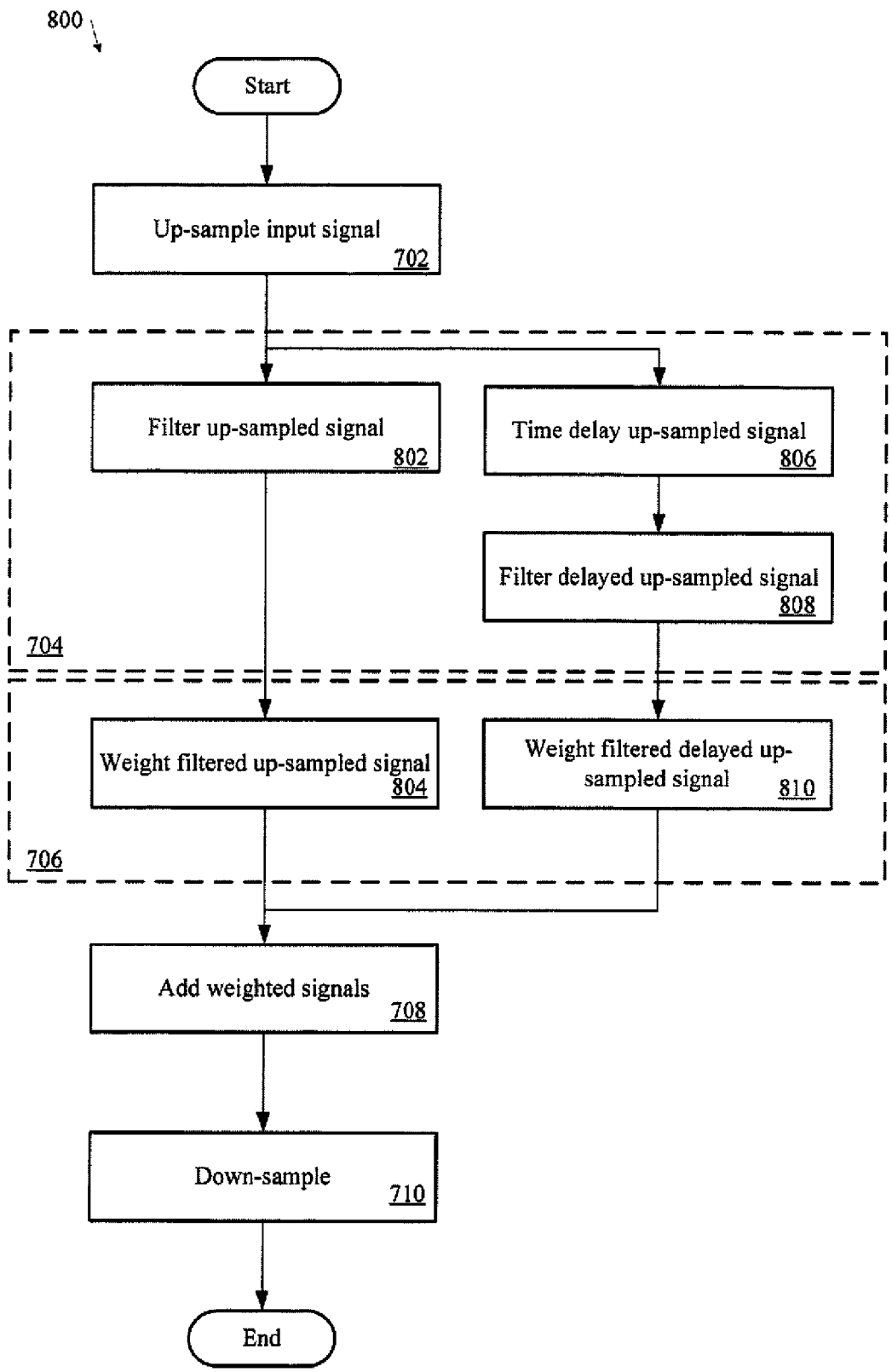
FIG. 8 shows acts that the system may take to convert between sampling rates.

FIG. 8 also shows acts 800 that the system 100 may take to convert an input signal sampling rate to an output signal sampling rate. The system 100 up-samples a discrete input signal by a factor of L (Act 702). The system 100 also filters the up-sampled signal (Act 802), delays the up-sampled signal (Act 806), and filters the delayed up-sampled signal (Act 808). The system 100 may convolve the up-sampled signal and/or delayed up-sampled signal with an impulse response of a low-pass filter to perform the filtering.

The system 100 may also weight the filtered signals. In particular, the system 100 may weight the filtered up-sampled signal (Act 804) and weight the filtered delayed up-sampled signal (Act 810) with different weights (e.g., a(m) and 1−a (m)). To generate a discrete output signal (e.g., an intermediate output signal $v_L(n)$) with a different output signal sampling rate than the input signal sampling rate, the system 100 may add the weighted signals (Act 708). The system 100 may also down-sample the intermediate output signal to produce a discrete resultant output signal (e.g., v(n)) with a resultant output signal sampling rate different from either input signal sampling rate of the input signal (Act 710), the intermediate signal sampling rate, or both.

Figure 9:
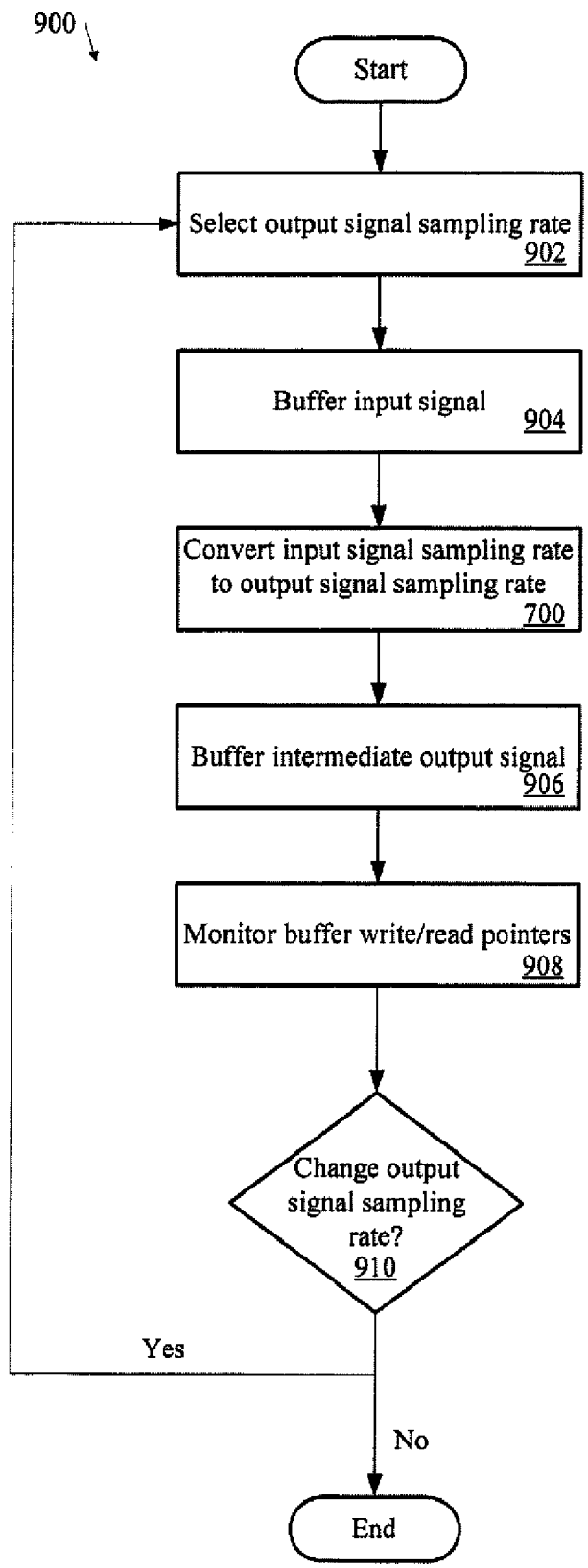
FIG. 9 shows acts that the system may take to dynamically convert between an input signal sampling rate and a temporally varying output signal sampling rate.

FIG. 9 shows acts 900 that the system 600 may take to dynamically convert between an input signal sampling rate and a temporally varying output signal sampling rate. The system 600 may select a time-dependent output signal sampling rate (Act 902). A ring buffer may buffer an input signal (Act 904), Sampling rate conversion logic in the system 600 may generate an intermediate output signal characterized by the selected time-dependent output signal sampling rate. A controller may determine the selected time-dependent output signal sampling rate, giving consideration to a correction term and other parameter information (Act 700). The system 600 may buffer the intermediate output signal into a ring buffer (Act 906).

Buffer monitoring logic may monitor the ring buffer write/read pointers to determine if the ring buffers are empty or have overflowed (Act 908). If the system 600 detects that a buffer is empty or has overflowed, or has a capacity that is above or below predetermined upper or lower thresholds, the system 600 may decide to change the output signal sampling rate (Act 910) to avoid or to try to correct these buffer conditions. To that end, the system 600 may choose a new time-dependent output signal sampling rate (Act 902). Alternatively, the system 600 may change the selected output signal sampling rate at any time in response to external input, newly arising processing considerations (e.g., processing done by other tasks in the device that may require different sampling rates), and other considerations.

The logic described above may be encoded in a computer readable medium such as a CD-ROM, disk, flash memory, RAM or ROM, an electromagnetic signal, or other machine readable medium as instructions for execution by a processor. Accordingly, the processor may execute the instructions to perform sampling rate adaptation. Alternatively or additionally, the logic may be implemented as analog or digital logic using hardware, such as one or more integrated circuits, or one or more processors executing sampling rate adaptation instructions; or in software in an application programming interface (API) or in a Dynamic Link Library (DLL), as functions available in a shared memory or defined as local or remote procedure calls; or as a combination of hardware and software.

The logic may be encoded on a computer-readable medium, machine-readable medium, propagated-signal medium, and/or signal-bearing medium. The media may comprise any device that contains, stores, communicates, propagates, or transports software for use by or in connection with an instruction executable system, apparatus, or device. The machine-readable medium may selectively be, but is not limited to, an electronic, magnetic, optical, electromagnetic, infrared, or semiconductor system, apparatus, device, or propagation medium. A non-exhaustive list of examples of a machine-readable medium includes: an electrical connection having one or more wires, a portable magnetic or optical disk, a volatile memory such as a Random Access Memory "RAM", a Read-Only Memory "ROM", optical memory, an Erasable Programmable Read-Only Memory (i.e., EPROM) or Flash memory, or an optical fiber. A machine-readable medium may also include a tangible medium upon which executable instructions are printed, as the logic may be electronically stored as an image or in another format (e.g., through an optical scan), then compiled, and/or interpreted or otherwise processed. The processed medium may then be stored in a computer and/or machine memory.

The systems 100 and 600 may include additional or different logic and may be implemented in many different ways. A controller may be implemented as a microprocessor, microcontroller, application specific integrated circuit (ASIC), discrete logic, or a combination of other types of circuits or logic. Similarly, memories may be DRAM, SRAM, Flash, or other types of memory. Parameters (e.g., conditions and thresholds), and other data structures may be separately stored and managed, may be incorporated into a single memory or database, or may be logically and physically organized in many different ways. Programs and instruction sets may be parts of a single program, separate programs, or distributed across several memories and processors. The systems 100 and 600 may be included in a wide variety of electronic devices, including a cellular phone, a headset, a hands-free set, a speakerphone, communication interface, or an infotainment system.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method of converting an input signal sampling rate to a different output signal sampling rate, comprising:
    up-sampling the input signal to obtain an up-sampled signal;
    low-pass filtering the up-sampled signal to obtain a first filtered up-sampled signal;
    time-delaying the up-sampled signal to obtain a time-delayed up-sampled signal;
    low-pass filtering the time-delayed up-sampled signal to obtain a second filtered up-sampled signal;
    weighting the first filtered up-sampled signal by a first weight factor to obtain a first weighted signal;
    weighting the second filtered up-sampled signal by a second weight factor to obtain a second weighted signal; and
    adding the first weighted signal and the second weighted signal to obtain an output signal with a selected output signal sampling rate that differs from the input signal sampling rate.

2. The method of claim 1, where low-pass filtering the up-sampled signal and low-pass filtering the time-delayed up-sampled signal comprise finite impulse response filtering.

3. The method of claim 1, where the time-delayed up-sampled signal comprises the up-sampled input signal delayed by one sample period with respect to the up-sampled signal.

4. The method of claim 2, where low-pass filtering the time-delayed up-sampled signal comprises finite impulse response filtering with a time delayed impulse response.

5. The method of claim 2, where up-sampling the input signal comprises inserting nulls between signal samples of the input signal.

6. The method of claim 2, where low-pass filtering the up-sampled signal comprises convolving the input signal with an impulse response of a finite impulse response filter.

7. The method of claim 6, where low-pass filtering the up-sampled signal further comprises filtering with time-dependent filter coefficients.

8. The method of claim 1, where the first weight factor and the second weight factor comprise time-dependent weight factors.

9. The method of claim 1, where the first weight factor and the second weight factor comprise constant factors.

10. The method of claim 1, where the second weight factor comprises a value of about 1 minus the first weight factor.

11. A signal processing system for converting an input signal sampling rate to a different output signal sampling rate, comprising:
    up-sampling logic operable to obtain an up-sampled signal from the input signal;
    first low-pass logic operable to filter the up-sampled signal to obtain a first filtered up-sampled signal;
    time-delay logic operable to delay the up-sampled signal to obtain a time-delayed up-sampled signal;
    second low-pass filtering logic operable to filter the time-delayed up-sampled signal to obtain a second filtered up-sampled signal;
    weighting logic operable to apply a first weight factor to the first filtered up-sampled signal to obtain a first weighted signal;
    weighting logic operable to apply a second weight factor to the second filtered up-sampled signal to obtain a second weighted signal; and
    adder logic operable to add the first weighted signal and the second weighted signal to obtain an output signal with a selected output signal sampling rate that differs from the input signal sampling rate.

12. The system of claim 11, further comprising down-sampling logic operable to down-sample the output signal to obtain a resultant signal with a resultant signal sampling rate that is different than the selected output signal sampling rate, and where the first weight factor comprises a value dependent on the input signal sampling rate, and the resultant signal sampling rate.

13. The system of claim 12, where the resultant signal sampling rate comprises a time-dependent resultant signal sampling rate.

14. The system of claim 13, further comprising a buffer that stores samples of the input signal and of the output signal.

15. The system of claim 14, where the resultant signal sampling rate comprises a value dependent on a sampling rate correction term.

16. The system of claim 14, where the buffer comprises a ring buffer.

17. The system of claim 12, where the resultant signal sampling rate comprises a time-dependent sampling rate.

18. A machine readable medium storing machine executable instructions for a processor in a signal processing system, the instructions comprising:
    up-sampling logic operable to obtain an up-sampled signal from the input signal;
    first low-pass logic operable to filter the up-sampled signal to obtain a first filtered up-sampled signal;
    time-delay logic operable to delay the up-sampled signal to obtain a time-delayed up-sampled signal;
    second low-pass filtering logic operable to filter the time-delayed up-sampled signal to obtain a second filtered up-sampled signal;
    weighting logic operable to apply a first weight factor to the first filtered up-sampled signal to obtain a first weighted signal;
    weighting logic operable to apply a second weight factor to the second filtered up-sampled signal to obtain a second weighted signal;
    adder logic operable to add the first weighted signal and the second weighted signal to obtain an output signal with a selected output signal sampling rate that differs from the input signal sampling rate.

19. The machine readable medium of claim 18, further comprising down-sampling logic operable to down-sample the output signal to obtain a resultant signal with a resultant signal sampling rate that is different than the selected output signal sampling rate, and where the first weight factor comprises a value dependent on the input signal sampling rate, and the resultant signal sampling rate.

20. The machine readable medium of claim 19, where the resultant signal sampling rate comprises a time-dependent resultant signal sampling rate.

* * * * *